(12) United States Patent
Huang et al.

(10) Patent No.: US 8,089,140 B2
(45) Date of Patent: Jan. 3, 2012

(54) LEAD FRAME ASSEMBLY, LEAD FRAME AND INSULATING HOUSING COMBINATION, AND LED MODULE HAVING THE SAME

(75) Inventors: Shih-Chung Huang, Taipei (TW); Chen-Hsiu Lin, Taipei (TW); Meng-Sung Chou, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 135 days.

(21) Appl. No.: 12/585,715

(22) Filed: Sep. 23, 2009

(65) Prior Publication Data

US 2010/0072509 A1  Mar. 25, 2010

(30) Foreign Application Priority Data

Sep. 25, 2008 (CN) .......................... 2008 1 0198897
Mar. 5, 2009 (CN) .......................... 2009 1 0037696

(51) Int. Cl.
*H01L 23/495* (2006.01)

(52) U.S. Cl. ......... 257/676; 257/E23.031; 257/E33.066; 174/536

(58) Field of Classification Search .................... 257/99, 257/676, E23.031, E33.066, 690, 701, 723; 174/536, 535, 537, 559

See application file for complete search history.

(56) References Cited

U.S. PATENT DOCUMENTS 5,461,255 A * 10/1995 Chan et al. .................... 257/672
2007/0059867 A1 * 3/2007 Kuo et al. ..................... 438/128

* cited by examiner

*Primary Examiner* — Thomas L Dickey
*Assistant Examiner* — Nikolay Yushin
(74) *Attorney, Agent, or Firm* — Rosenberg, Klein & Lee

(57) ABSTRACT

A unitary lead frame assembly having a plurality of lead frame sets each comprises a first lead frame unit. The first lead frame unit has a pair of first and second frame portions extending along a first direction and spaced apart from each other along a second direction different from the first direction. The lead frame set further comprises at least two second lead frame units disposed between the first and second frame portions and spaced apart from each other along the second direction. Each of the second lead frame units cooperates with the first lead frame unit to define at least one first die-bonding area therebetween.

20 Claims, 11 Drawing Sheets

LEAD FRAME ASSEMBLY, LEAD FRAME AND INSULATING HOUSING COMBINATION, AND LED MODULE HAVING THE SAME

CROSS-REFERENCE TO RELATED APPLICATIONS

This application claims priority of Chinese Application No. 200810198897.8, filed on Sep. 25, 2008, and Chinese Application No. 200910037696.4, filed on Mar. 5, 2009.

BACKGROUND OF THE INVENTION

1. Field of the Invention

The invention relates to a light emitting diode (LED) module, more particularly to an LED module comprising a unitary conductive lead frame assembly adapted for mounting light emitting dies.

2. Description of the Related Art

A conventional panel light source employs a plurality of light emitting dies as light sources. The light emitting dies are disposed on a printed circuit board through reflow soldering and wave soldering processes. However, since the size of the light emitting dies is small, it is difficult to align the light emitting dies with the printed circuit board during the soldering processes.

SUMMARY OF THE INVENTION

Therefore, the object of the present invention is to provide an improved light emitting diode (LED) module adapted for mounting light emitting dies without installing a printed circuit board, thus alleviating the above drawback of the prior art.

According to an aspect of this invention, there is provided a light emitting diode (LED) module having a plurality of lead frame sets. Each of the conductive lead frame set comprises a first lead frame unit having a pair of first and second frame portions extending along a first direction and spaced apart from each other along a second direction different from the first direction, and at least two second lead frame units disposed between the first and second frame portions and spaced apart from each other along the second direction. Each of the second lead frame units cooperates with the first lead frame unit to define at least one first die-bonding area therebetween. An insulating housing is molded on the lead frame set and has a plurality of cavities. Each of the first die-bonding areas of the conductive lead frame set is exposed within a corresponding one of the cavities. A plurality of light emitting dies are mounted respectively at the first die-bonding areas of the conductive lead frame set. Due to inclusion of the conductive lead frame set in the LED module, a printed circuit board can be omitted to thereby facilitate fast mass production.

According to another aspect of this invention, there is provided a frame and housing combination comprising a plurality of lead frame sets including a first lead frame unit and at least two second lead frame units. The first lead frame unit has a pair of first and second frame portions extending along a first direction and are spaced apart from each other along a second direction different from the first direction. The second lead frame units are disposed between the first and second frame portions and spaced apart from each other along the second direction. Each of the second lead frame units cooperates with the first lead frame unit to define at least one first die-bonding area therebetween. An insulating housing is molded on the lead frame set and has a plurality of cavities. Each of the first die-bonding areas of the conductive lead frame set is exposed within a corresponding one of the cavities.

According to still another aspect of the present invention, there is provided an unitary conductive lead frame assembly including a plurality of lead frame sets each comprises a first lead frame unit. The first lead frame unit has a pair of first and second frame portions extending along a first direction and spaced apart from each other along a second direction different from the first direction. The lead frame set further comprises at least two second lead frame units disposed between the first and second frame portions and spaced apart from each other along the second direction. Each of the second lead frame units cooperates with the first lead frame unit to define at least one first die-bonding area therebetween.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
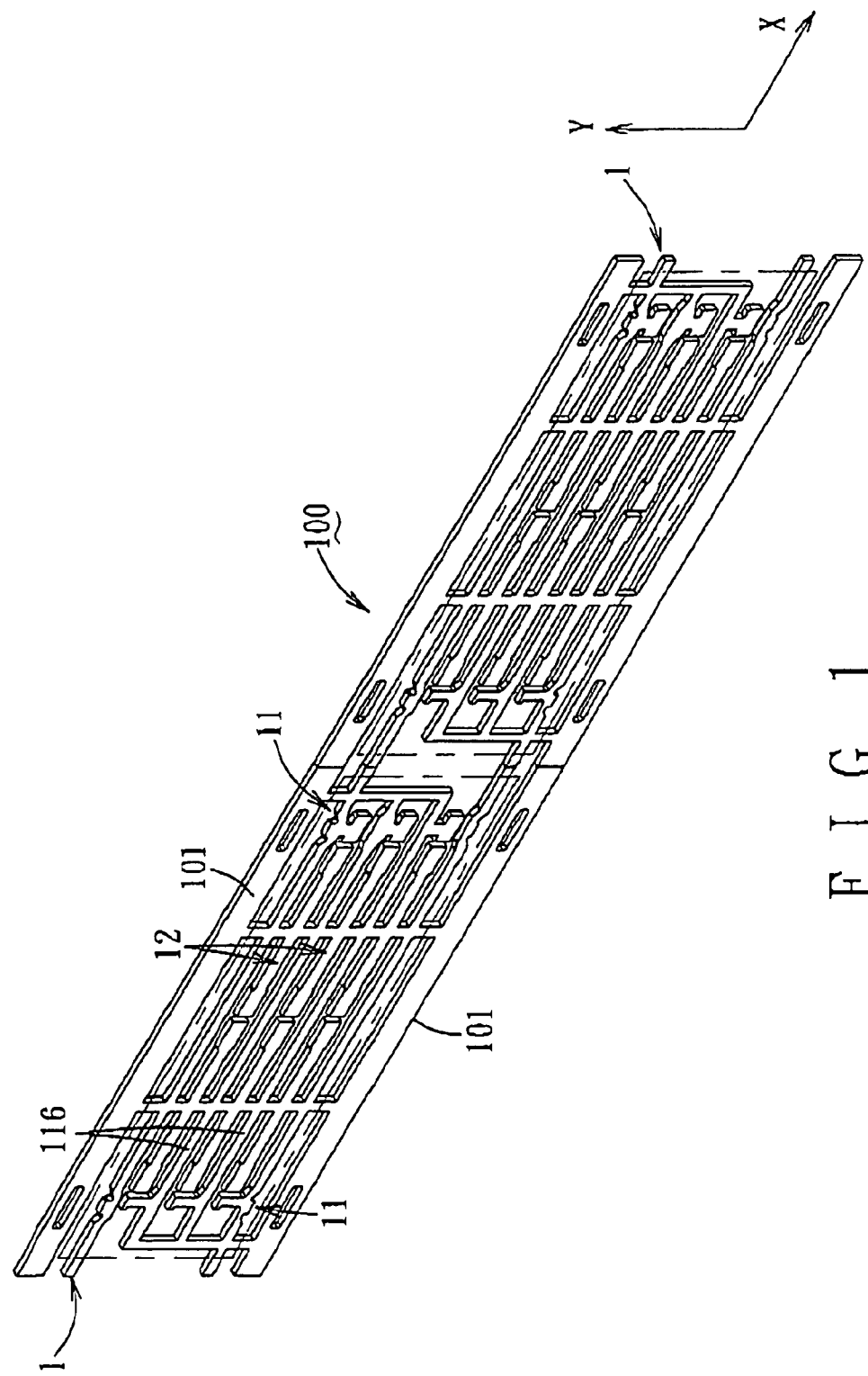
FIG. 1 is a perspective view of a first preferred embodiment of a unitary conductive lead frame assembly of the present invention.

Before the present invention is described in greater detail, it should be noted that like elements are denoted by the same reference numerals throughout the disclosure.

Figure 2:
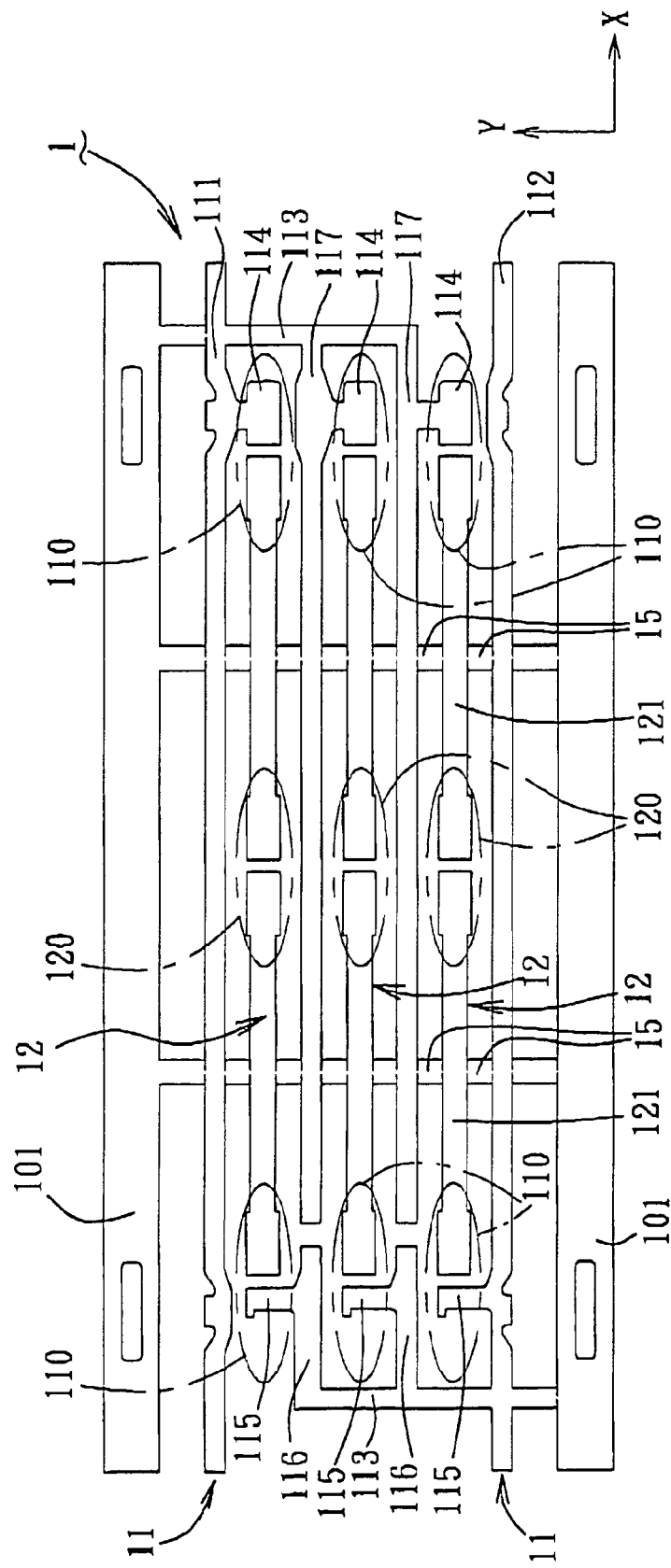
FIG. 2 is a fragmentary plan view of the conductive lead frame assembly of the first preferred embodiment illustrating a lead frame set to be cut so as to form two first lead frames, three second lead frame units each having two third frame portions, two side strips, and a plurality of connecting strips.
Figure 3:
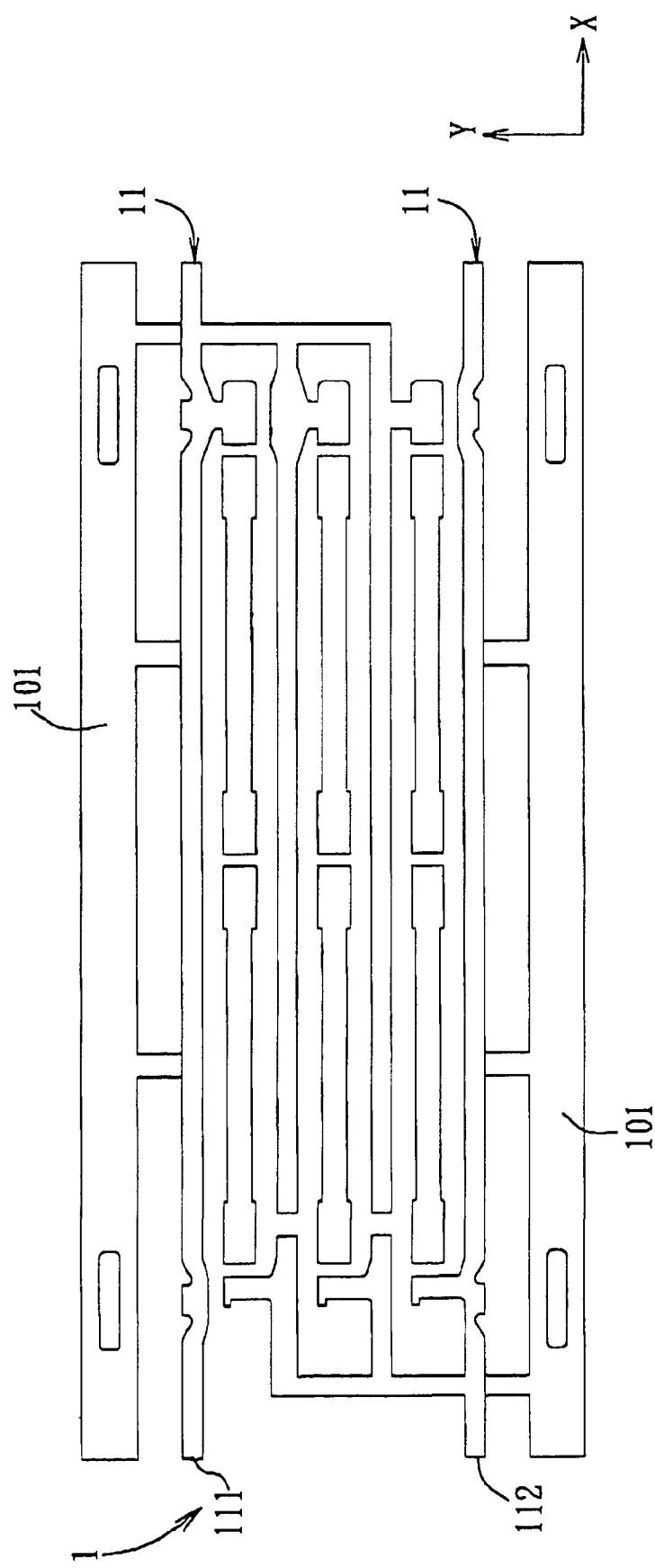
FIG. 3 is a plan view of the lead frame set of the first preferred embodiment without the connecting strips, which is cut at junctions between the first lead frames and the side strips.

Referring to FIGS. 1 and 2, a unitary conductive lead frame assembly 100 of a first preferred embodiment of the present invention is shown. The conductive lead frame assembly 100 can be cut into a plurality of lead frame sets 1 (only one is shown in FIG. 2), a plurality of connecting strips 15 (not shown in FIG. 3), and two side strips 101, as shown in FIG. 2. Further referring to FIG. 2, each of the lead frame sets 1 comprises a first lead frame unit including two first lead frames 11 having respectively a first frame portion 111 and a second frame portion 112. Any two of the first lead frame units of the lead frame sets 1 are connected electrically in parallel. The first and second frame portions 111, 112 of each of the lead frames sets 1 extend along the first direction (X) and are spaced apart from each other along a second direction (Y) different from the first direction (X). In this preferred embodiment, the second direction (Y) is perpendicular to the first direction (X). One of the first lead frames 11 having the first frame portion 111 comprises two first branches 117. The other one of the first lead frames 11 having the second frame portion 112 comprises two second branches 116, which are aligned respectively with the first branches 117 along the first direction (X). The first and second branches 117, 116 are disposed between the first and second frame portions 111, 112, and extend along the first direction (X). Any two adjacent ones of the first branches 117 and the first and second frame portions 111, 112 define a receiving space therebetween.

Each of the first lead frames 11 further has an extension 113 extending from a respective one of the first and second frame portions 111, 112 along the second direction (Y) to connect with corresponding ones of the first and second branches 117, 116. Each of the lead frame sets 1 further comprises three second lead frame units 12 disposed between the extensions 113 of the first lead frames 11, located respectively within the receiving spaces, and spaced apart from each other along the second direction (Y). Each of the second lead frame units 12 comprises two third frame portions 121 extending along the first direction (X) and spaced apart from each other along the first direction (X). For each of the second lead frame units 12 in this preferred embodiment, each of the third frame portions 121 has one end cooperating with a respective one of the first lead frames 11 to define a first die-bonding area 110 therebetween, and the other end cooperating with the other one of the third frame portions 121 to define a second die-bonding area 120 therebetween.

The connecting strips 15 connect the second lead frame units 12 to the first lead frame unit. The side strips 101 flank an assembly of the lead frame sets 1. Each of the side strips 101 interconnects the first lead frame units of the lead frame sets 1.

The first lead frame unit further comprises a plurality of first protuberances 114 and a plurality of second protuberances 115. The first protuberances 114 extend respectively from the first frame portion 111 and the first branches 117 toward the second frame portion 112 along the second direction (Y), and are disposed in proximity to one of the extensions 113. The second protuberances 115 extend respectively from the second frame portion 112 and the second branches 116 toward the first frame portion 111 along the second direction (Y), and are disposed in proximity to the other one of the extensions 113. Each of the first die-bonding areas 110 of the lead frame set 1 is defined by a corresponding one of the second lead frame units 12 and a respective one of the first and second protuberances 114, 115.

Figure 4:
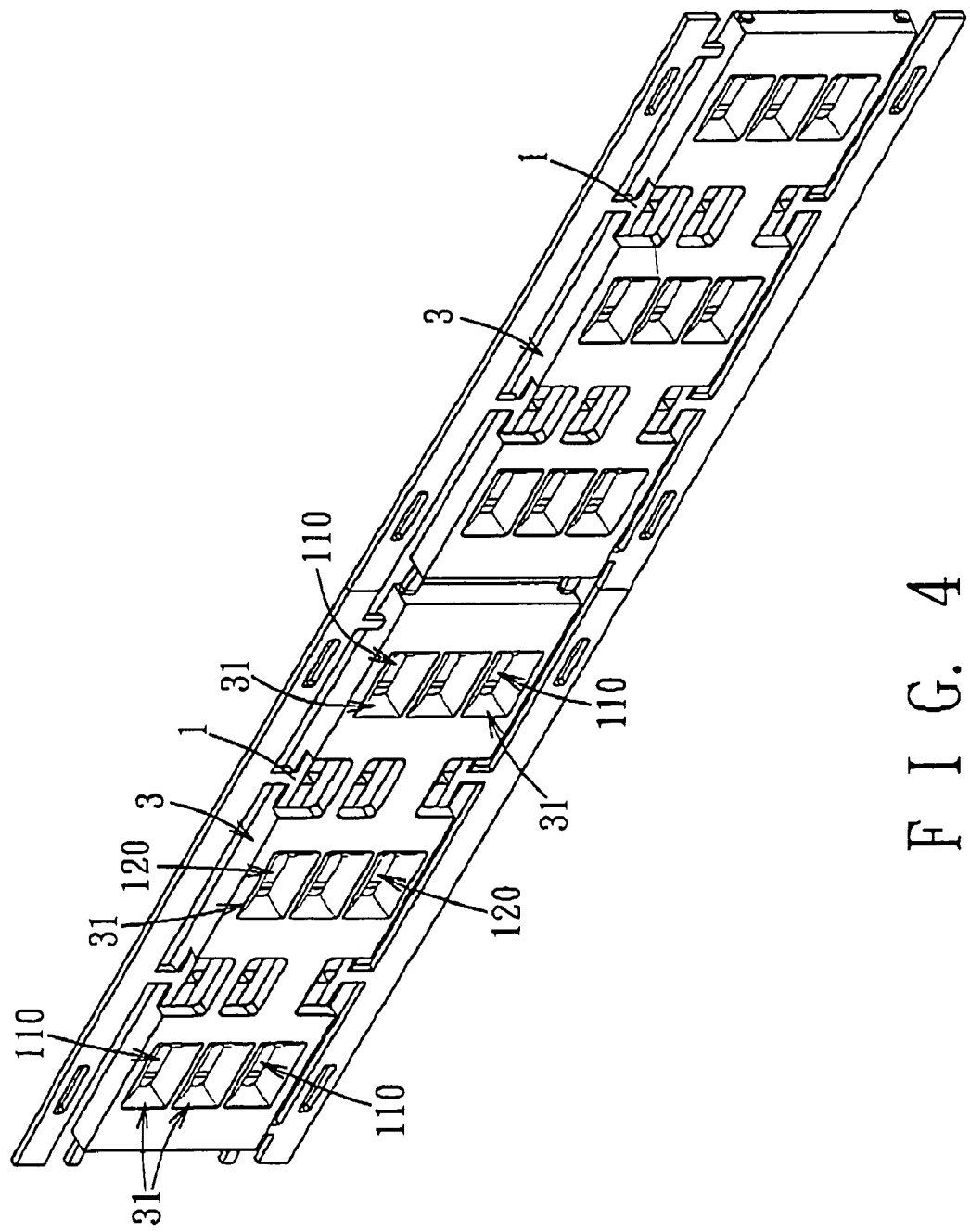
FIG. 4 is a perspective view of a combination of the lead frame sets of the first preferred embodiment and two insulating housings.
Figure 5:
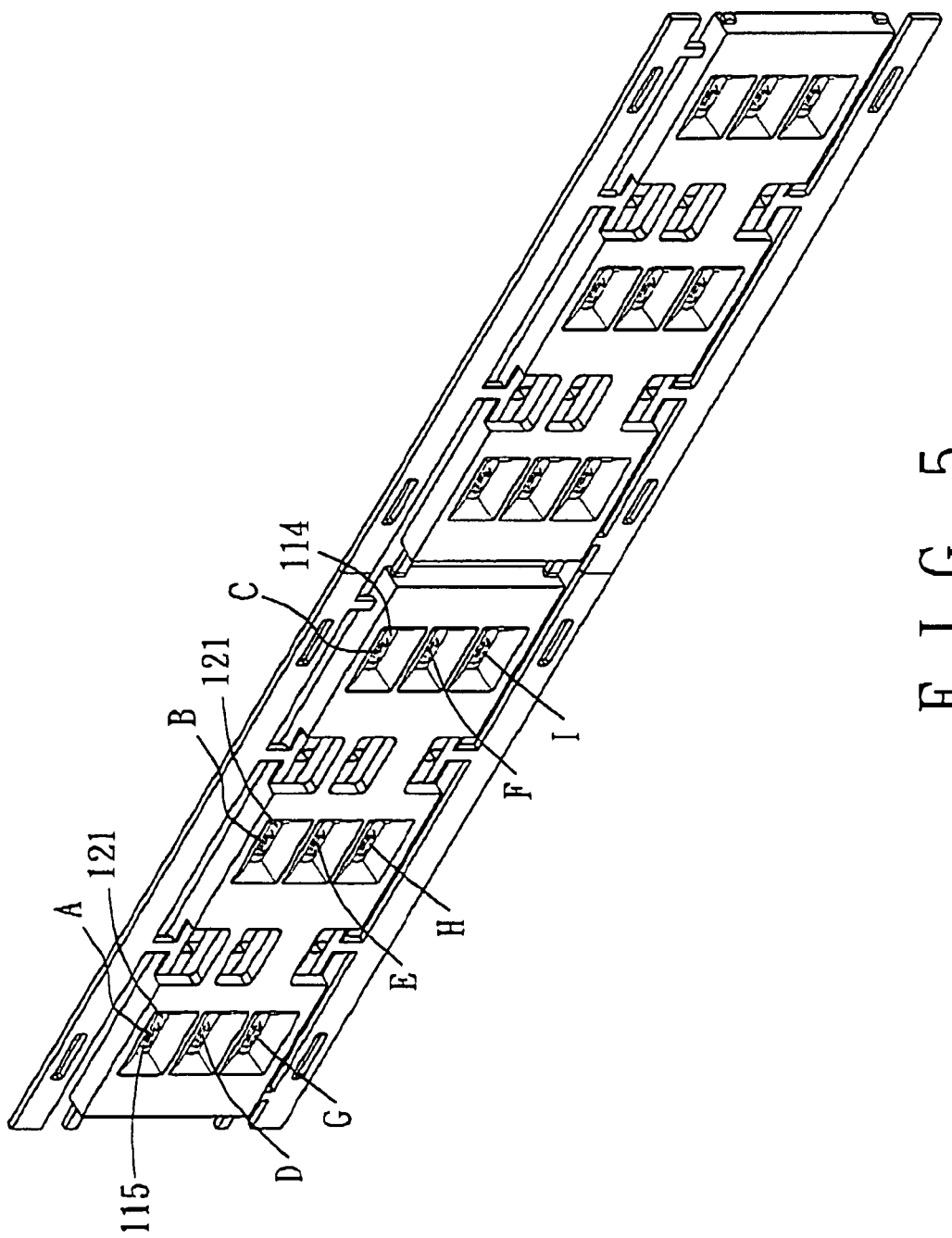
FIG. 5 is a perspective view of the combination of the lead frame sets of the first preferred embodiment and the insulating housings, and a plurality of light emitting dies, illustrating the light emitting dies mounted on the lead frame sets.
Figure 6:
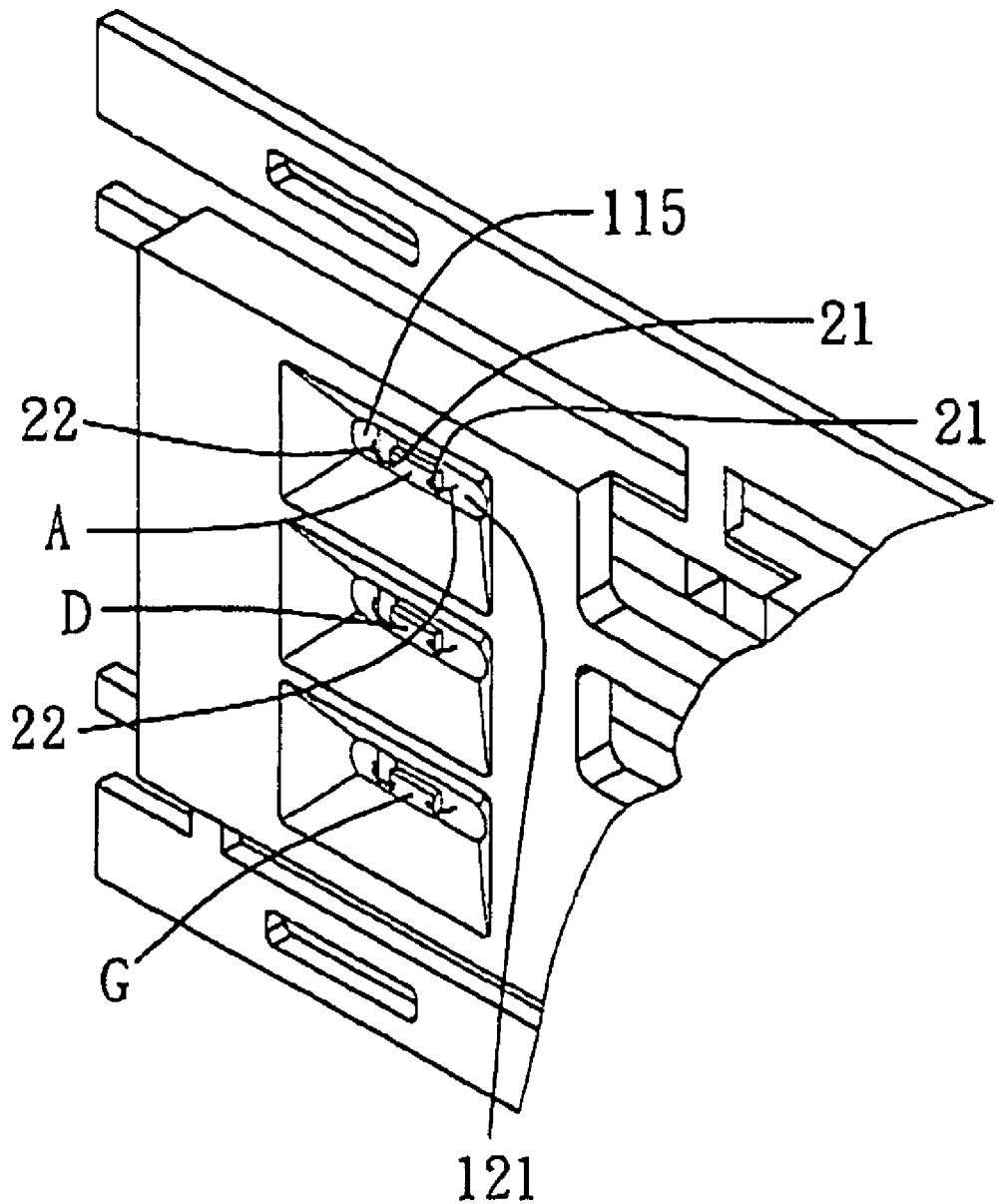
FIG. 6 is a fragmentary enlarged view of FIG. 5.

As shown in FIG. 4, when it is desired to form an LED module, a plurality of insulating housings 3 (only two are shown) are molded respectively on the lead frame sets 1. Each insulating housing 3 has a plurality of cavities 31. Each of the first and second die-bonding areas 110, 120 of the lead frame sets 1 is exposed within a corresponding one of the cavities 31. After the insulating housings 3 are molded on the lead frame sets 1, the connecting strips 15 (see FIG. 2) can be removed (see FIG. 3) As further shown in FIGS. 5 and 6, a plurality of light emitting dies (A-I) are mounted respectively at the first and second die-bonding areas 110, 120. Each of the light emitting dies (A-I) has two electrode contacts 21 each electrically connected to a corresponding one of the protuberances 114, 115 of the first lead frame unit and the third frame portions 121, through a wire 22. Therefore, the light emitting dies (A-C), (D-F), (G-I) (see FIG. 8) in each of three rows are mounted in series connection to each other, and the three rows of the light emitting dies (A-C), (D-F), (G-I) are in parallel connection to each other. Any two of the LED module are connected electrically in parallel.

Figure 7:
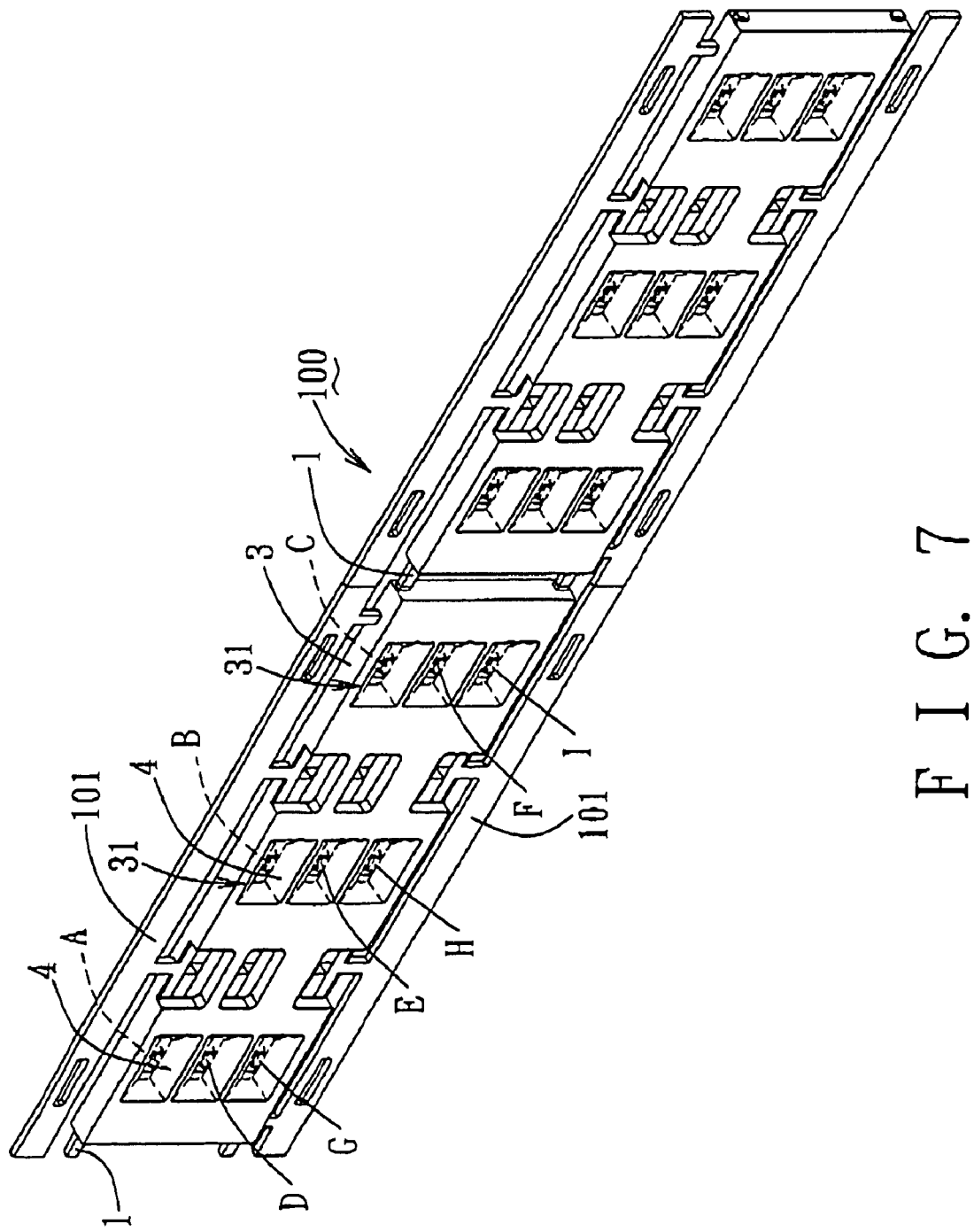
FIG. 7 is a view similar to FIG. 5, but illustrating each of a plurality of cavities of the insulating housings being filled with a light transmissive colloidal material.

Referring to FIG. 7, each of the cavities 31 of the insulating housings 3 is filled with a light transmissive colloidal material 4 so as to package the light emitting dies (A-I). Afterwards, the side strips 101 that interconnect the first lead frame units are removed to form the LED module. At this time, the conductive lead frame assembly 100 can be cut so that the lead frame sets 1 are separated from each other. Hence, two separate members are formed. Each of the separate members has a structure shown in FIG. 8.

Figure 8:
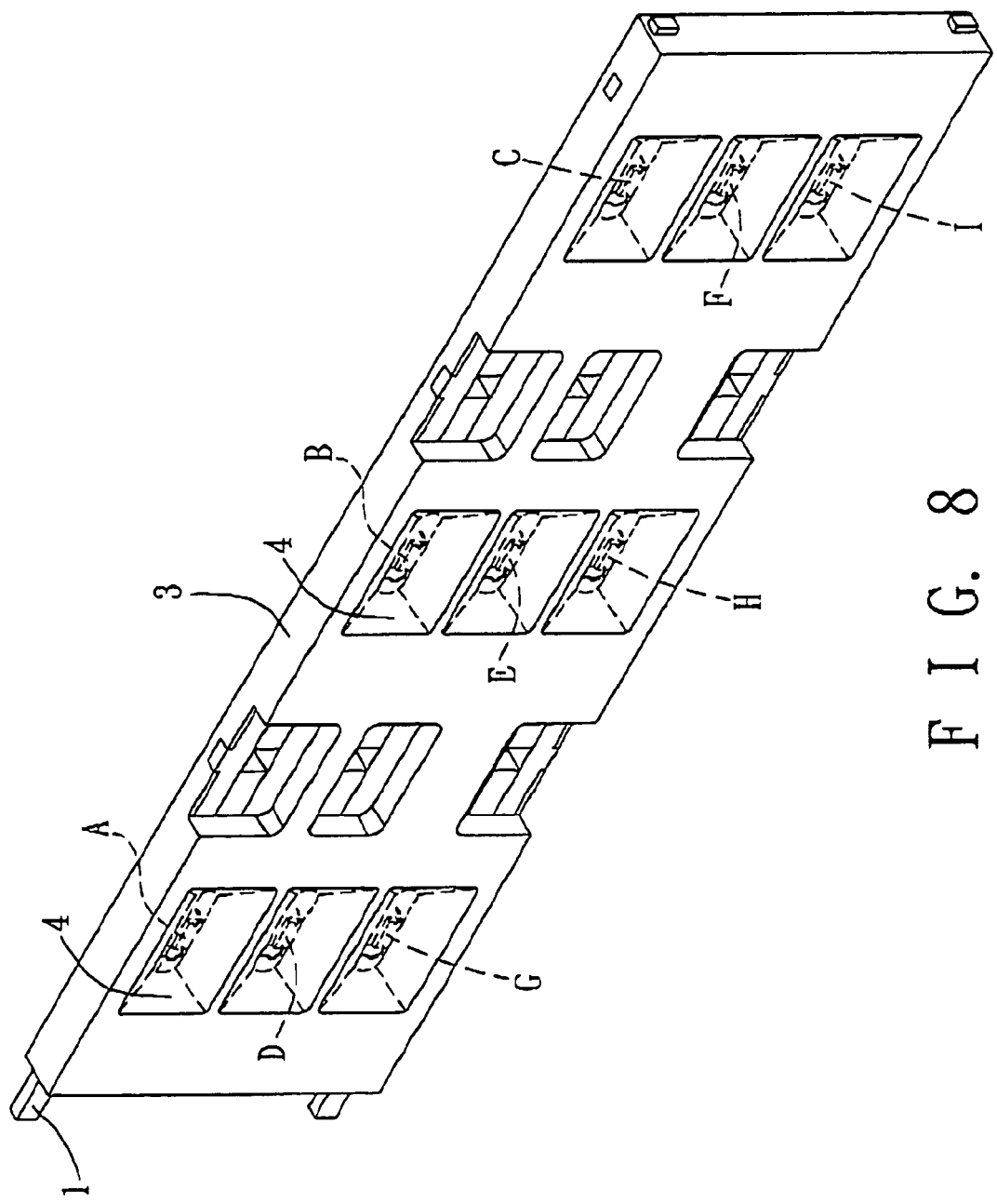
FIG. 8 is a fragmentary perspective view of a light emitting diode (LED) module including the lead frame sets of the first preferred embodiment.

As shown in FIG. 8, the lead frame set 1 of the first preferred embodiment cooperates with the insulating housing 3, the light emitting dies (A-I), and the light transmissive colloidal materials 4 to form the LED module. A portion of the lead frame set 1 is exposed outside of the insulating housing 3 to connect with an external power source.

Figure 9:
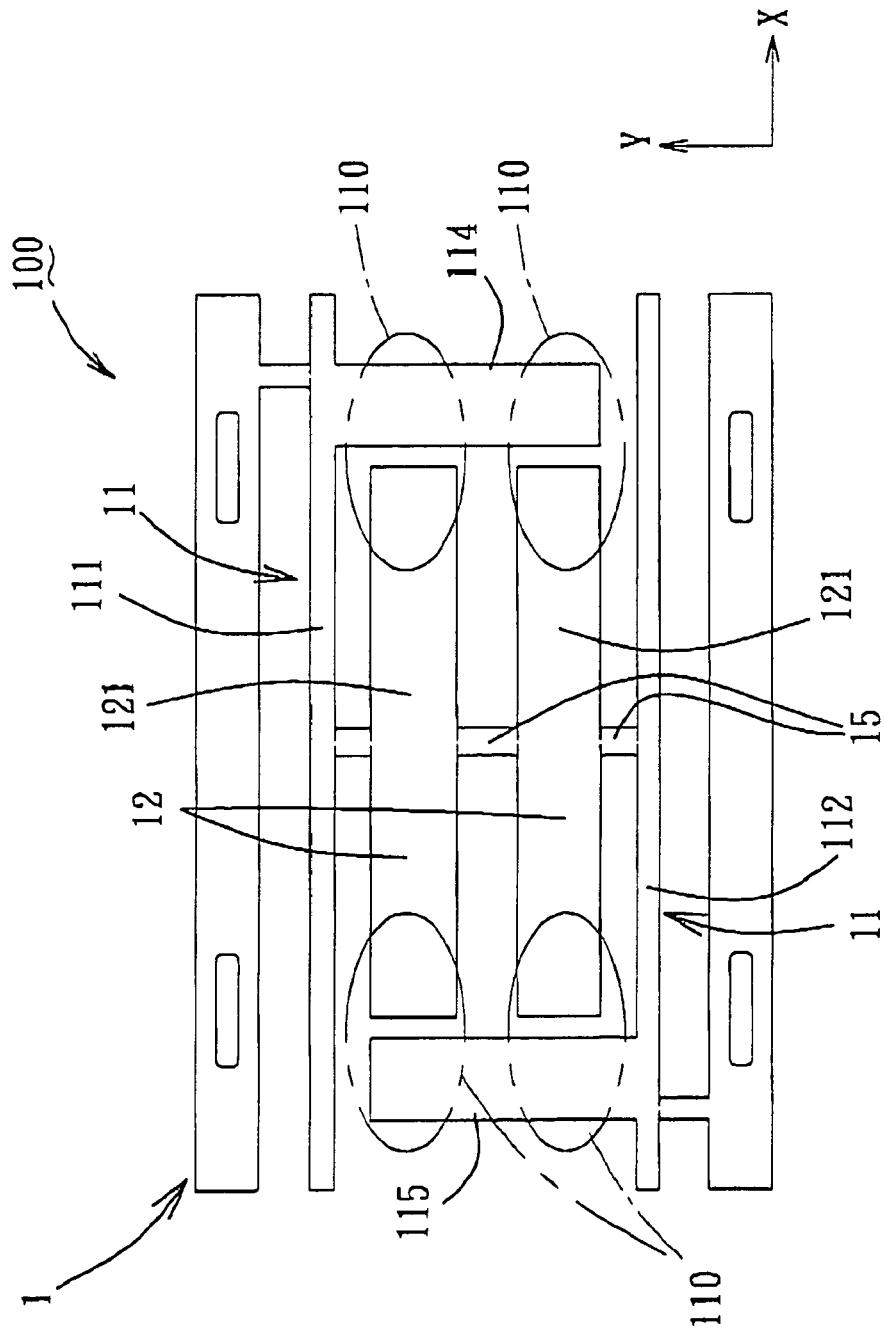
FIG. 9 is a fragmentary plan view of a second preferred embodiment of a unitary conductive lead frame assembly of the present invention, illustrating how a lead frame set thereof is cut to form two first lead frames, two second lead frame units, two side strips, and a plurality of connecting strips.

As shown in FIG. 9, a modified unitary conductive lead frame assembly 100 of a second preferred embodiment of this invention has a structure similar to that of the first embodiment, and comprises a plurality of lead frame sets 1 (only one is shown). The main difference between the lead frame assembly 100 of the second preferred embodiment and the first preferred embodiment resides in the configuration of the first lead frame unit and the second lead frame units 12. In the second preferred embodiment, the first lead frames 11 respectively have a first protuberance 114 and a second protuberance 115 each extending from a respective one of the first and second frame portions 111, 112 along the second direction (Y). Each of the second lead frame units 12 comprises a third frame portion 121 disposed between the first and second protuberances 114, 115 of the first lead frames 11. The third frame portion 121 has two ends each cooperating with a corresponding one of the protuberances 114, 115 to define a first die-bonding area 110 therebetween. After the insulating housings 3 (see FIG. 4) are molded respectively on the lead frame sets 1, the connecting strips 15 can be removed. The second preferred embodiment has the same advantages as those of the first preferred embodiment.

Figure 10:
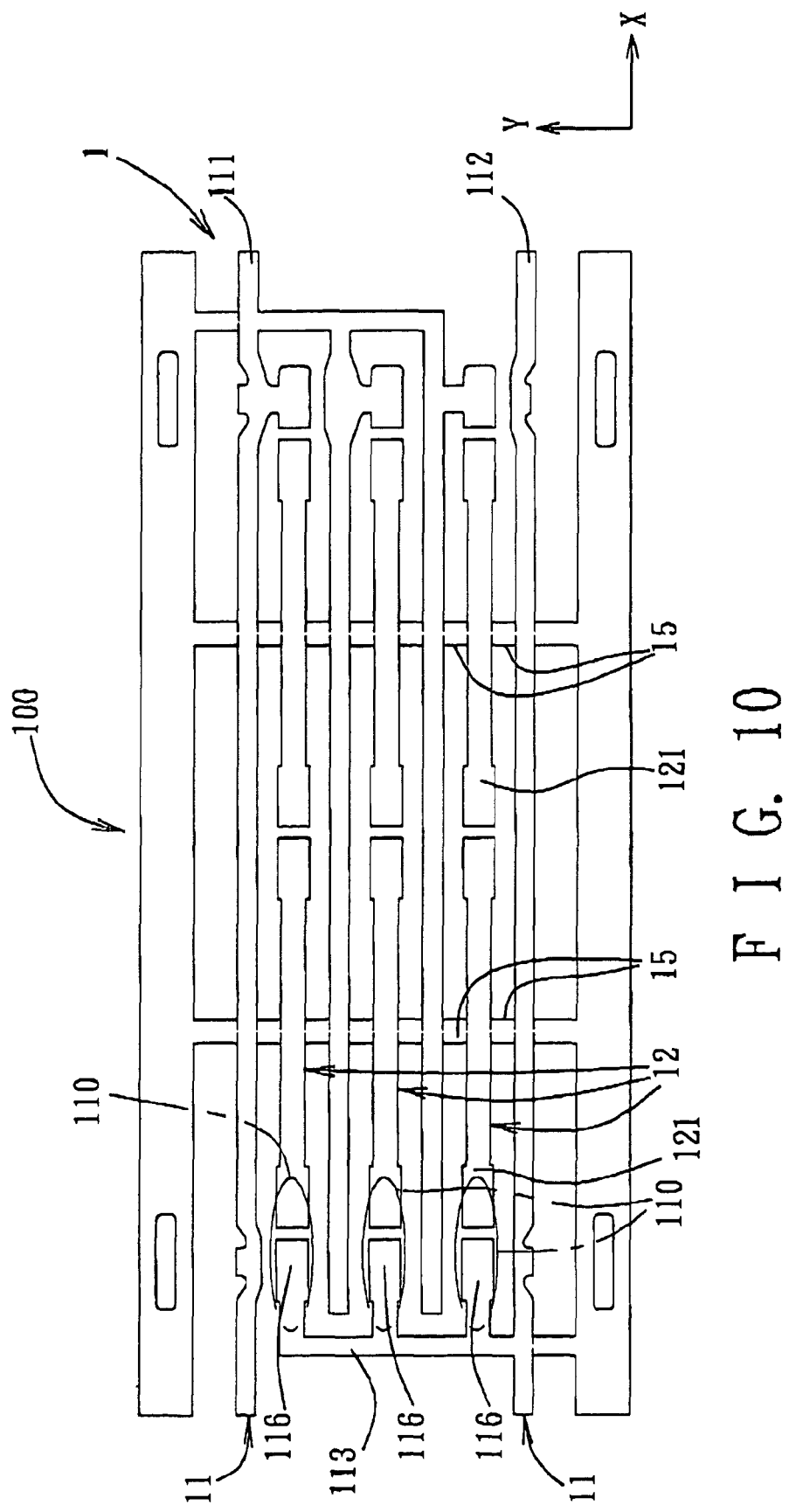
FIG. 10 is a fragmentary plan view of a third preferred embodiment of a unitary conductive lead frame assembly of the present invention, illustrating how a lead frame set thereof is cut to form two first lead frames, two second lead frame units, two side strips, and a plurality of connecting strips.

As shown in FIG. 10, a modified unitary conductive lead frame assembly 100 of a third preferred embodiment of this invention has a structure similar to that of the first embodiment. The main difference between the lead frame assemblies 100 of the third preferred embodiment and the first preferred embodiment resides in the configuration of the first lead frame unit. In the third preferred embodiment, one of the first lead frames 11 having the second frame portion 112 comprises three second branches 116 disposed between the first and second frame portions 111, 112, spaced apart from each other along the second direction (Y), and extending along the first direction (X) toward the second lead frame units 12, respectively. One of the extensions 113 extends from the second frame portion 112, and is connected with the second lengthwise portions 116. Each of the second branches 116 cooperates with an adjacent one of the third frame portions 121 of a respective one of the second lead frame units 12 to define a first die-bonding area 110 therebetween. After the insulating housings 3 are molded on the lead frame sets 1, the connecting strips 15 can be removed. The third preferred embodiment has the same advantages as those of the first preferred embodiment.

Figure 11:
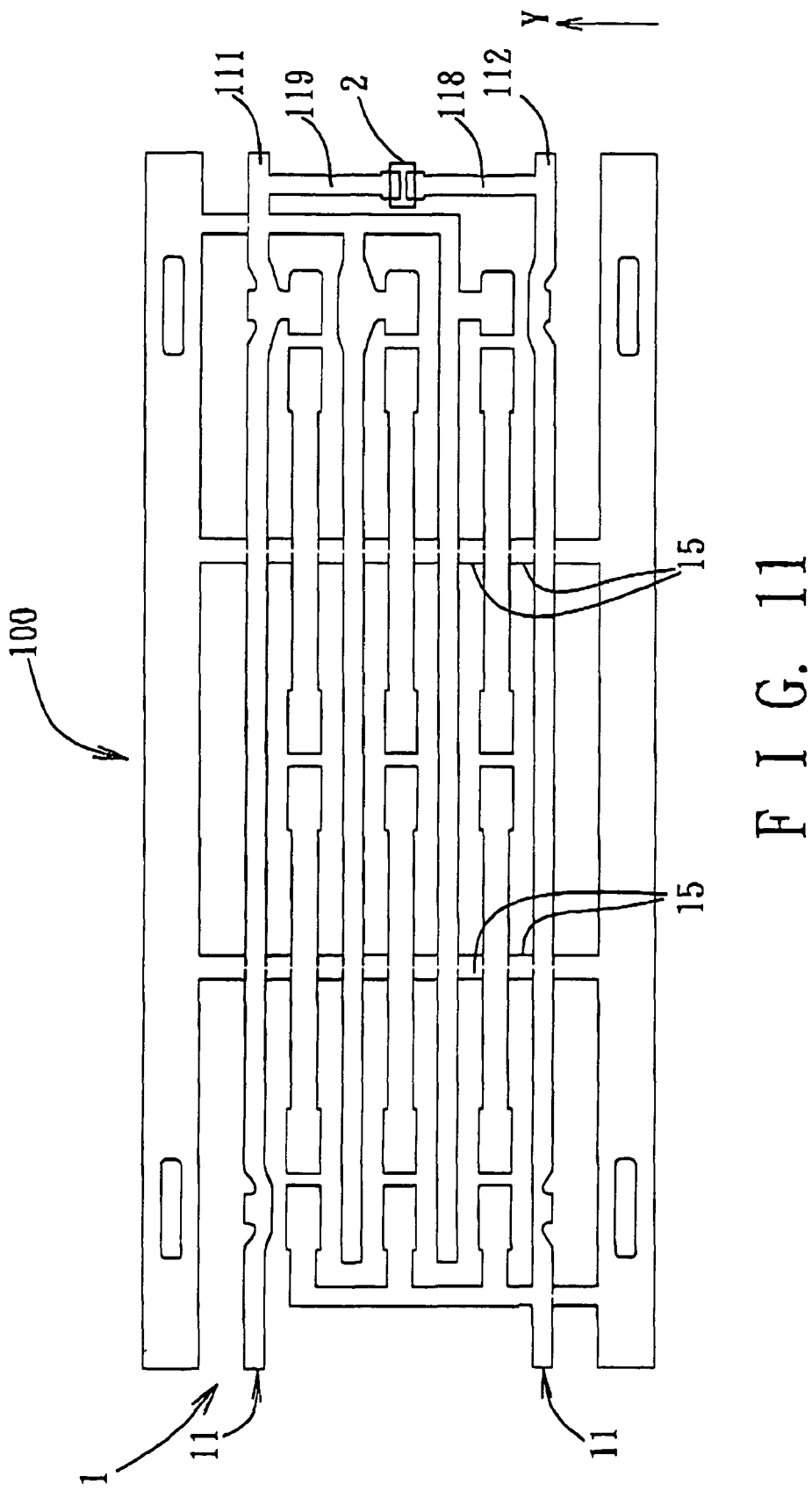
FIG. 11 is a fragmentary plan view of a fourth preferred embodiment of a unitary conductive lead frame assembly of the present invention, illustrating how a lead frame set thereof is cut to form two first lead frames, two second lead frame units, two side strips, and a plurality of connecting strips.

As shown in FIG. 11, a modified unitary conductive lead frame assembly 100 of a fourth preferred embodiment of this invention has a structure similar to that of the third embodiment. The main difference between the lead frame assemblies 100 of the fourth preferred embodiment and the third preferred embodiment resides in the configuration of the first lead frame unit. In the fourth preferred embodiment, the first lead frames 11 further include respectively branch frame portions 118, 119 each extending from a respective one of the first and second frame portions 111, 112 along the second direction (Y) toward the other one of the first and second frame portions 111, 112, such that an antistatic member 2 may be disposed therebetween. After the insulating housings 3 (see FIG. 4) are molded respectively on the lead frame sets 1, the connecting strips 15 can be removed. The fourth preferred embodiment has the same advantages as those of the first preferred embodiment.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A unitary conductive lead frame assembly having a plurality of lead frame sets, wherein each of said lead frame sets comprising:
   a first lead frame unit having a pair of first lead frames, said pair of first lead frames respectively having a pair of first and second frame portions extending along a first direction and spaced apart from each other along a second direction different from the first direction, said pair of first lead frames being spaced apart along said second direction;
   at least two second lead frame units disposed between said pair of first lead frames and spaced apart from each other along the second direction, each of said second lead frame units cooperating with said first lead frame unit to respectively define at least one first die-bonding area therebetween; and
   a pair of side strips extending in said first direction and being respectively spaced from said pair of first lead frames in said second direction and being connected thereto.

2. The unitary conductive lead frame assembly as claimed in claim 1, wherein each of said second lead frame units comprises at least two third frame portions extending along the first direction and spaced apart from each other along the first direction, and any two adjacent said third frame portions of a respective one of said second lead frame units cooperating with each other to define a respective second die-bonding area therebetween.

3. The unitary conductive lead frame assembly as claimed in claim 1 further comprising a plurality of connecting strips connecting said second lead frame units to said first lead frame unit, whereby, after the insulating housing is molded on said lead frame set, said connecting strips and said side strips are removed from said first and second lead frame units.

4. The conductive lead frame assembly as claimed in claim 1, wherein any two of said first lead frame units are connected electrically in parallel.

5. The unitary conductive lead frame assembly as claimed in claim 1, wherein said first lead frame unit comprises two first lead frames each having a protuberance and a respective one of said first and second frame portions, each of said second lead frame units comprising a third frame portion disposed between said protuberances of said first lead frames and having two ends each cooperating with a corresponding one of said protuberances to define a respective one of said first die-bonding areas of said lead frame set therebetween.

6. The unitary conductive lead frame assembly as claimed in claim 5, wherein each of said first lead frames further comprises a branch frame portion extending from a respective one of said first and second frame portions along the second direction toward the other one of said first and second frame portions, said branch frame portions of said first lead frames being adapted to permit an antistatic member to be disposed therebetween.

7. The unitary conductive lead frame assembly as claimed in claim 1, wherein said first frame portion includes at least one first branch, and said second frame portion includes at least one second branch, said first and second branches being disposed between said first and second frame portions, extending along the first direction and being aligned with each other along the first direction.

8. The unitary conductive lead frame assembly as claimed in claim 7, wherein each of said first lead frames further has a extension extending from a respective one of said first and second frame portions along the second direction to connect with a corresponding one of said first and second branches, such that said second lead frame units are disposed between said extensions of said first lead frames.

9. The unitary conductive lead frame assembly as claimed in claim 8, wherein said first lead frame unit further comprises a plurality of first protuberances extending respectively from said first frame portion and said first branch toward said second frame portion along the second direction and disposed in proximity to one of said extensions and a plurality of second protuberances extending respectively from said second frame portion and said second branch toward said first frame portion along the second direction and disposed in proximity to the other one of said extensions, each of said first die-bonding areas of said lead frame set being defined by a corresponding one of said second lead frame units and a respective one of said first and second protuberances.

10. The unitary conductive lead frame assembly as claimed in claim 8, wherein one of said first lead frames having said second frame portion comprises at least two said second branches disposed between said first and second frame portions, spaced apart from each other along the second direction, and extending along the first direction toward said second lead frame units, respectively, one of said extensions extending from said second frame portion and being connected with said second branches, each of said first die-bonding areas of said lead frame set being defined by a corresponding one of said second lead frame units and a respective one of said second branches.

11. A frame and housing combination comprising:
   a plurality of lead frame sets, each lead frame set including:
   a. a first lead frame unit having a pair of first and second frame portions extending along a first direction and spaced apart from each other along a second direction different from the first direction, and b. at least two second lead frame units disposed between said first and second frame portions and spaced apart from each other along the second direction, each of said second lead frame units cooperating with said first lead frame unit to define at least one first die-bonding area therebetween; and an insulating housing molded on each of said lead frame sets and having a plurality of cavities, each of said first die-bonding areas of each said conductive lead frame set being exposed within a corresponding one of said cavities.

12. A light emitting diode (LED) module comprising:
a plurality of lead frame sets comprising
   a first lead frame unit having a pair of first and second frame portions extending along a first direction and spaced apart from each other along a second direction different from the first direction, and
   at least two second lead frame units disposed between said first and second frame portions and spaced apart from each other along the second direction, each of said second lead frame units cooperating with said first lead frame unit to define at least one first die-bonding area therebetween;
an insulating housing molded on said lead frame set and having a plurality of cavities, each of said first die-bonding areas of said conductive lead frame set being exposed within a corresponding one of said cavities; and
a plurality of light emitting dies mounted respectively at said first die-bonding areas of said lead frame set.

13. The light emitting diode module as claimed in claim 12, wherein each of said second lead frame units comprises at least two third frame portions extending along the first direction and spaced apart from each other along the first direction, and any two adjacent said third frame portions of a respective one of said second lead frame units cooperating with each other to define a respective second die-bonding area therebetween.

14. The light emitting diode module as claimed in claim 12 further comprising two side strips flanking an assembly of said lead frame sets, each of said side strips interconnecting said first lead frame units of said lead frame sets.

15. The light emitting diode module as claimed in claim 12, wherein said first lead frame unit comprises two first lead frames each having a protuberance and a respective one of said first and second frame portions, each of said second lead frame units comprising a third frame portion disposed between said protuberances of said first lead frames and having two ends each cooperating with a corresponding one of said protuberances to define a respective one of said first die-bonding areas of said conductive lead frame set therebetween.

16. The light emitting diode module as claimed in claim 12, wherein said first lead frame unit comprises two first lead frames having respectively said first and second frame portions, one of said first lead frames having said first frame portion comprising at least one first branch, the other one of said first lead frames having said second frame portion comprising at least one second branch, said first and second branches being disposed between said first and second frame portions, extending along the first direction and being aligned with each other along the first direction.

17. The light emitting diode module as claimed in claim 16, wherein each of said first lead frames further has a extension extending from a respective one of said first and second frame portions along the second direction to connect with a corresponding one of said first and second branches, such that said second lead frame units are disposed between said extensions of said first lead frames.

18. The light emitting diode module as claimed in claim 17, wherein said first lead frame unit further comprises a plurality of first protuberances extending respectively from said first frame portion and said first branch toward said second frame portion along the second direction and disposed in proximity to one of said extensions, and a plurality of second protuberances extending respectively from said second frame portion and said second branch toward said first frame portion along the second direction and disposed in proximity to the other one of said extensions, each of said first die-bonding areas of said lead frame set being defined by a corresponding one of said second lead frame units and a respective one of said first and second protuberances.

19. The light emitting diode module as claimed in claim 18, wherein one of said first lead frames having said second frame portion comprises at least two said second branches disposed between said first and second frame portions, spaced apart from each other along the second direction, and extending along the first direction toward said second lead frame units, respectively, one of said extensions extending from said second frame portion and being connected with said second lengthwise portions, each of said first die-bonding areas of said lead frame set being defined by a corresponding one of said second lead frame units and a respective one of said second branches.

20. The light emitting diode module as claimed in claim 19, wherein each of said first lead frames further comprises a branch frame portion extending from a respective one of said first and second frame portions along the second direction toward the other one of said first and second frame portions, said branch frame portions of said first lead frames being adapted to permit an antistatic member to be disposed therebetween.

* * * * *